(12) United States Patent
Chou et al.

(10) Patent No.: US 7,666,792 B2
(45) Date of Patent: Feb. 23, 2010

(54) METHOD FOR FABRICATING A DEEP TRENCH IN A SUBSTRATE

(75) Inventors: Chung-Yen Chou, Taipei County (TW);
Hai-Han Hung, Taoyuan County (TW);
Teng-Wang Huang, Taipei Hsien (TW);
Shin-Yu Nieh, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 36 days.

(21) Appl. No.: 12/035,443

(22) Filed: Feb. 22, 2008

(65) Prior Publication Data
US 2009/0130853 A1    May 21, 2009

(30) Foreign Application Priority Data
Nov. 21, 2007    (TW) ................................ 96144097 A (51) Int. Cl.
*H01L 21/311*    (2006.01)

(52) U.S. Cl. ........................ 438/702; 438/386; 438/637; 438/680; 438/243; 438/239

(58) Field of Classification Search ................. 438/702, 438/386, 243, 239
See application file for complete search history.

(56) References Cited

U.S. PATENT DOCUMENTS 6,544,855 B1*    4/2003    Tews et al. .................. 438/386

* cited by examiner

*Primary Examiner*—Matthew Smith
*Assistant Examiner*—Wilner Jean Baptiste
(74) *Attorney, Agent, or Firm*—Winston Hsu (57) ABSTRACT

The invention provides a method for forming a deep trench in a substrate. A sacrificial layer and a liner layer are first used to define the deep trench pattern. The sacrificial layer is then replaced with a silicon glass layer. A thick mask layer includes the silicon glass layer, the liner layer and a silicon nitride layer is formed on the substrate. Through an opening of the thick mask layer, a deep trench is etched into the substrate.

17 Claims, 8 Drawing Sheets

METHOD FOR FABRICATING A DEEP TRENCH IN A SUBSTRATE

BACKGROUND OF THE INVENTION

1. Field of the Invention

The present invention relates generally to semiconductor processes and, more particularly, to a method for fabricating a deep trench in a substrate.

2. Description of the Prior Art

Along with the development of miniaturization of various electronic products, the design of the dynamic random access memory (DRAM) elements has to meet the requirements of high integration and high density. DRAMs with trench capacitor structures have become one of the main structures of high-integrated DRAM products used in the industry. This kind of DRAMs contains trench capacitors fabricated inside deep trenches that are formed in a semiconductor substrate by an etching process so as to effectively reduce a size of the memory cell and utilize space of chips well.

Typically, to form a high-aspect-ratio deep trench in a silicon substrate, a thick silicon oxide hard mask such as an undoped silicon glass (USG) layer or boron-doped silicon glass (BSG) layer is first deposited on the silicon substrate. Thereafter, a lithographic process is carried out to transfer a deep trench pattern onto the silicon oxide hard mask. After the silicon oxide hard mask is patterned, a dry etching process is then performed to etch the silicon substrate that is not covered by the patterned silicon oxide hard mask, thereby forming the deep trench.

However, the conventional method for forming the deep trench suffers from several drawbacks. The difference of an etching selectivity of the silicon oxide hard mask and of the silicon substrate is not high enough, which leads to the profile control problem during the formation of the deep trench in the silicon substrate. The profile control problem becomes worse when the dimension of the deep trench becomes smaller and the trench depth becomes deeper. Therefore, there is a strong need in this industry to provide a method for forming a deep trench with very high aspect ratio, wherein the sidewall profile of the deep trench is precisely controlled.

SUMMARY OF THE INVENTION

It is one objective of the present invention to provide an improved method for fabricating a deep trench, which is capable of precisely controlling the trench sidewall profile as well as the dimension of the deep trench, thereby solving the above-mentioned prior art problem.

According to the claimed invention, a method for fabricating a deep trench in a substrate is provided. A substrate having thereon a pad layer and a first sacrificing layer on the pad layer is prepared. The first sacrificing layer has at least one first opening. A lining layer is formed on interior surface of the first opening and on the first sacrificing layer. The first opening is filled with a second sacrificing layer. A top surface of the second sacrificing layer and the lining layer form a recessed area. A first insulating layer is formed within the recessed area. The first insulating layer and the lining layer encapsulate the second sacrificing layer. A portion of the lining layer is selectively etched away, thereby exposing the first sacrificing layer. The first sacrificing layer is completely removed, thereby forming a second opening. The second opening is filled with a second insulating layer. The first insulating layer is removed to expose the second sacrificing layer. The second sacrificing layer is completely removed, thereby forming a thick hard mask which includes the second insulating layer, the lining layer and the pad layer on the substrate. Using the thick hard mask as an etching hard mask, the substrate is etched to form a deep trench which is offset to the second opening.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
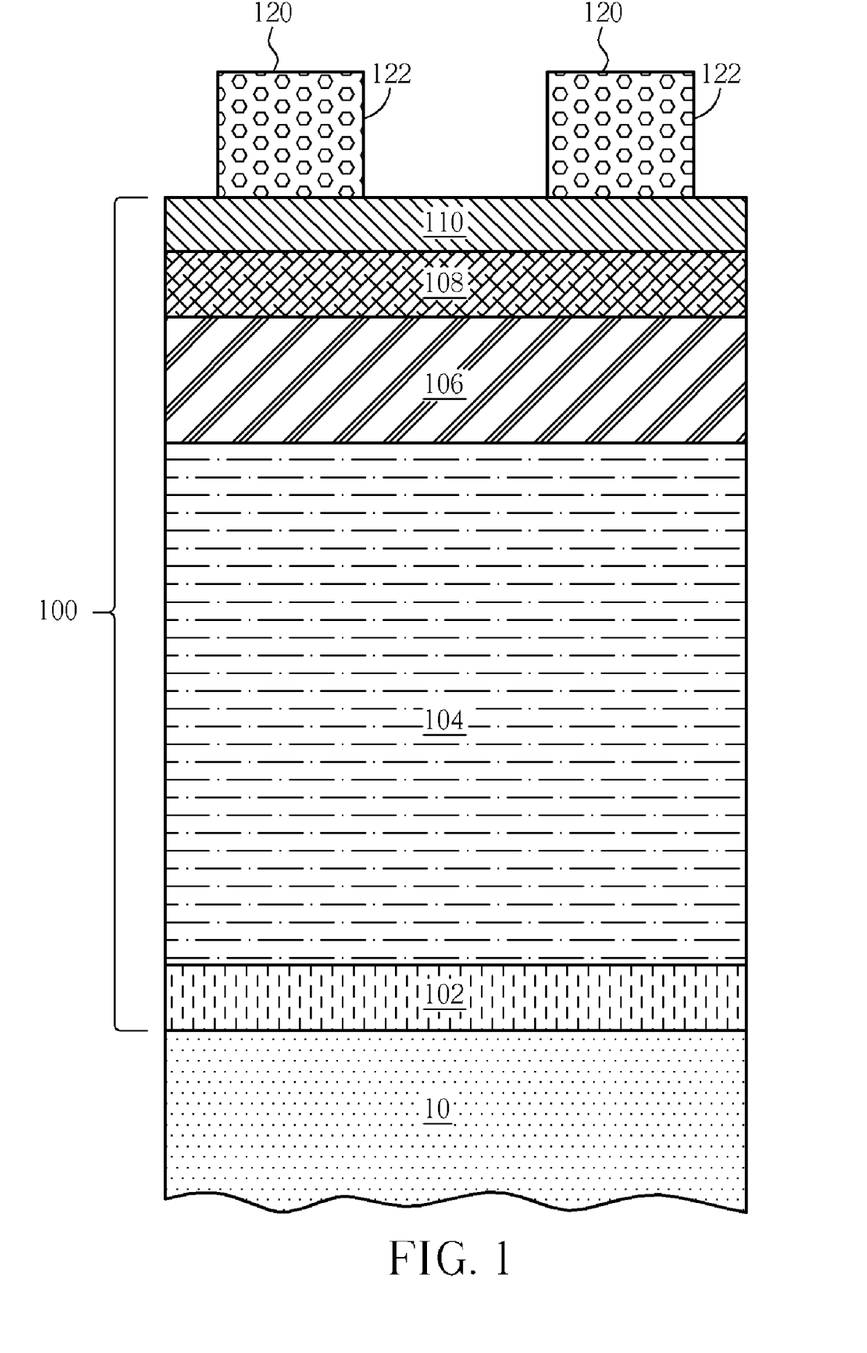
FIGS. 1-8 are schematic, cross-sectional diagrams illustrating a method for forming a deep trench in accordance with the preferred embodiment of this invention.

Please refer to FIG. 1 to FIG. 8. FIGS. 1-8 are schematic, cross-sectional diagrams illustrating a method for forming a deep trench in accordance with the preferred embodiment of this invention. First, as shown in FIG. 1, a film stack structure 100 is formed on a semiconductor substrate 10 such as a silicon substrate. According to the preferred embodiment of this invention, the film stack structure 100 includes but not limited to a pad layer 102, a sacrificing layer 104, a cap layer 106, a hard mask layer 108 and an anti-reflection layer 110.

Optionally, a silicon oxide liner may be interposed between the pad layer 102 and the semiconductor substrate 10. The anti-reflection layer 110 may be a silicon oxynitride layer. The hard mask layer 108 may be a carbon layer. The cap layer 106 may be a boron-doped silicon glass (BSG) layer or an undoped silicon glass (USG) layer.

According to the preferred embodiment of this invention, the sacrificing layer 104 is a silicon layer such as a polysilicon layer or an amorphous silicon layer. Preferably, the thickness of the sacrificing layer 104 ranges between 2000 angstroms and 5000 angstroms. Subsequently, a photoresist pattern 120 is formed on the anti-reflection layer 110. The photoresist pattern 120 has an opening 122 that approximately defines the position and pattern of the deep trench to be formed into the semiconductor substrate 10.

It is noteworthy that dimension of the opening 122 in the photoresist pattern 120 is slightly larger (e.g. 30 nm larger) than a target trench dimension of the deep trench to be formed into the semiconductor substrate 10. The aforesaid target trench dimension of the deep trench is denoted by number 190 through FIG. 2 to FIG. 8.

Figure 2:
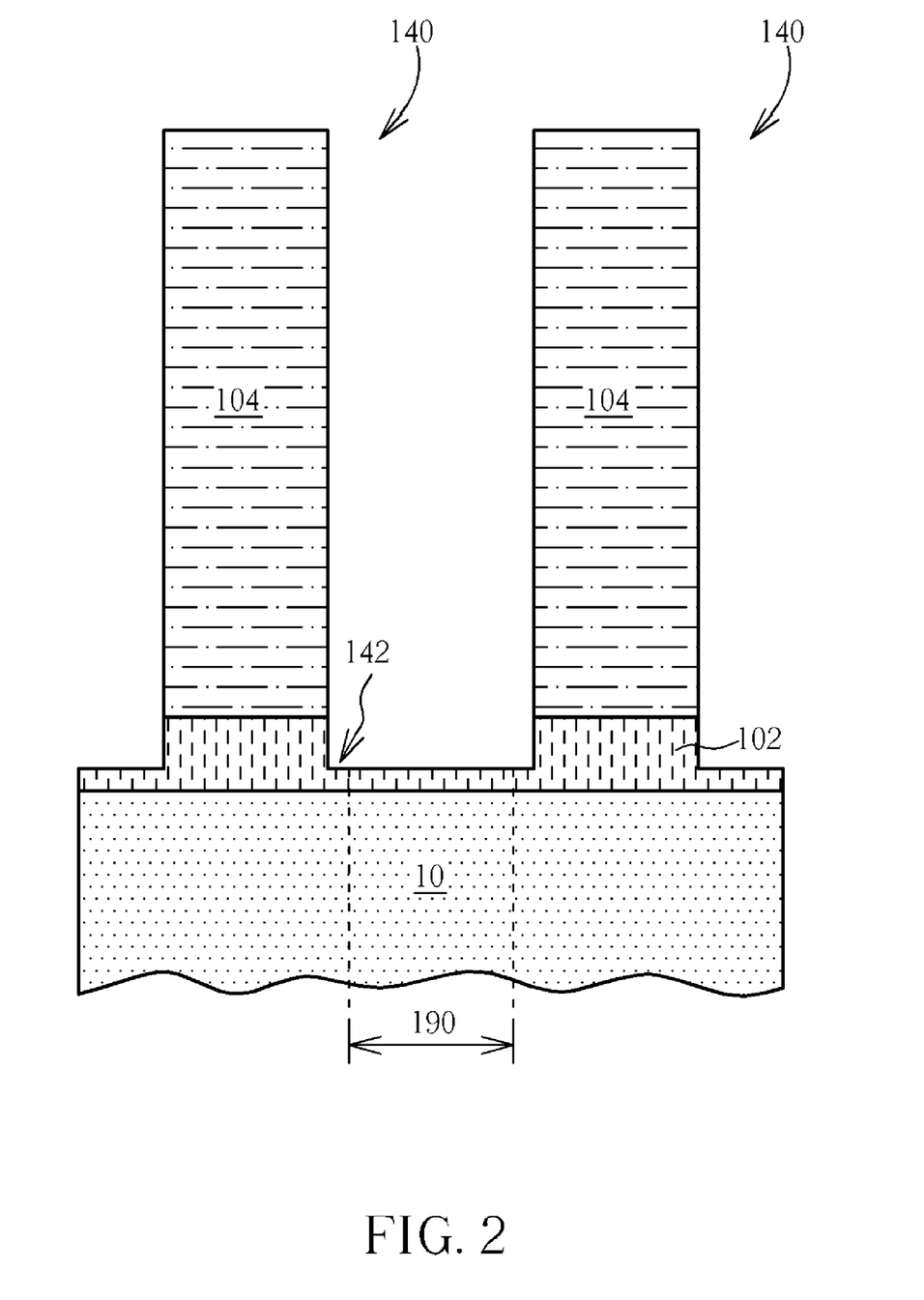

As shown in FIG. 2, a pattern transferring process is carried out to transfer the photoresist pattern 120 into the underlying sacrificing layer 104. The aforesaid pattern transferring process is a two-stage etching process, which includes two etch stages: (1) the first etch stage: etching the anti-reflection layer 110, the hard mask layer 108 and the cap layer 106 through the opening 122, thereby transferring the photoresist pattern 120 into the hard mask layer 108 and the cap layer 106; and (2) the second etch stage: using the patterned hard mask layer 108 and the cap layer 106 as an etching hard mask, continue to etch the sacrificing layer 104, thereby forming an opening 140 in the sacrificing layer 104.

According to the preferred embodiment of this invention, in the aforesaid second etch stage (i.e., the step of etching the sacrificing layer 104), the etching substantially stops on the pad layer 102. After the aforesaid second etch stage is finished, an over-etching step may be performed on the pad layer 102 to form a recessed area 142 on the pad layer 102.

In other embodiments, however, the pad layer 102 may be etched through in the aforesaid second etch stage, thereby exposing a portion of the semiconductor substrate 10. Thereafter, the remaining cap layer 106 over the sacrificing layer 104 is removed by methods known in the art, for example, wet etching methods.

Figure 3:
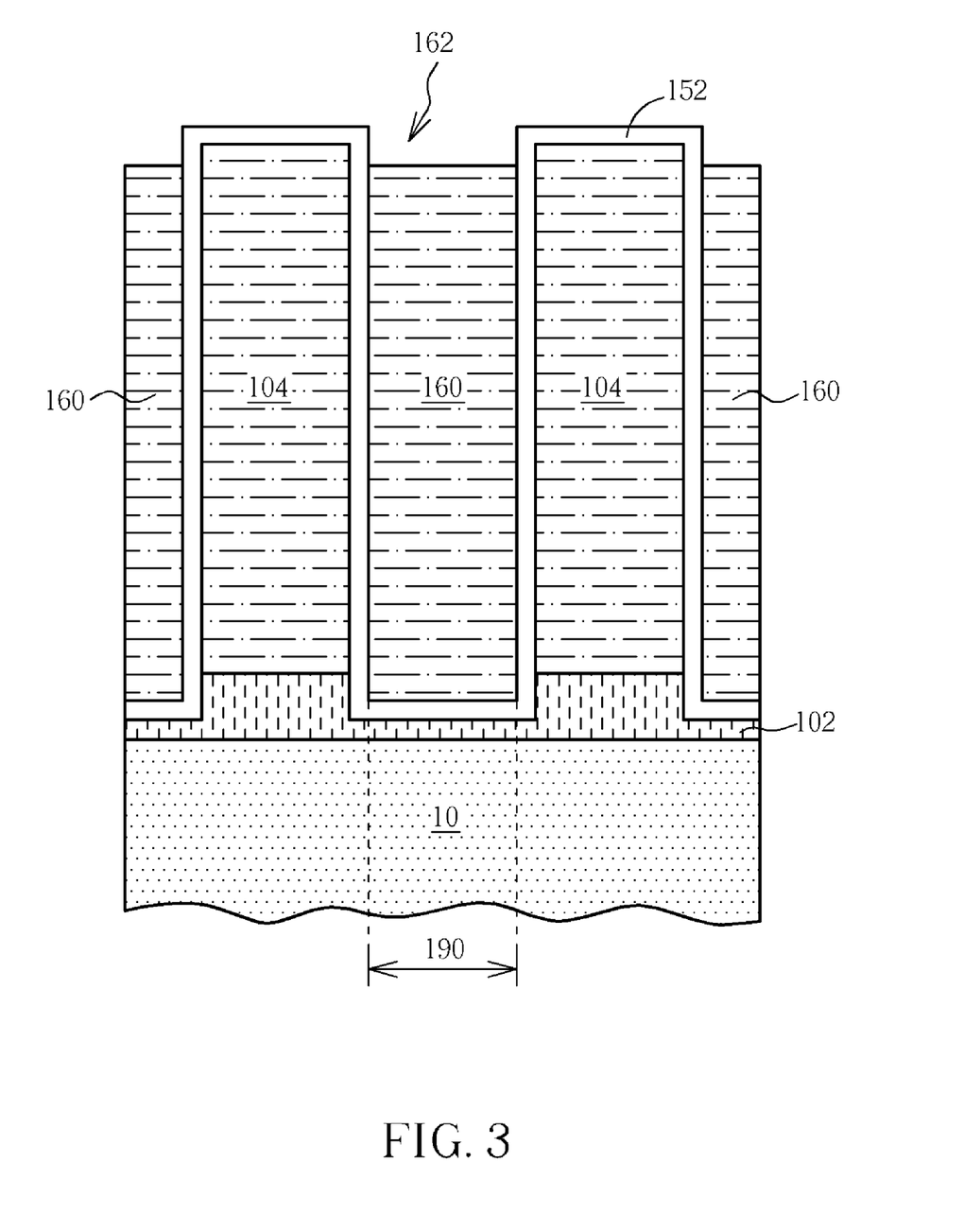

As shown in FIG. 3, a chemical vapor deposition (CVD) process is performed to deposit a conformal lining layer 152 such as a silicon nitride layer on the sacrificing layer 104, the interior surface of the opening 140 and the surface of the recessed area 142.

According to the preferred embodiment of this invention, the diameter of the opening 140 shrinks after depositing the lining layer 152 and can be adjusted by altering the final thickness of the lining layer 152 such that the diameter of the opening 140 after depositing the lining layer 152 is substantially equal to the target trench dimension 190 and that the deep trench to be etched into the semiconductor substrate 10 conforms to the target trench dimension 190. For example, in a case that the original diameter of the opening 140 before depositing the lining layer 152 is 30 nm larger than the target trench dimension 190 of the deep trench to be formed in the semiconductor 10, the thickness of the lining layer 152 is 15 nm.

Subsequently, another CVD process is carried out to blanket deposit a sacrificing layer 160 such as a polysilicon layer over the semiconductor substrate 10. The sacrificing layer 160 fills the opening 140. After the deposition of the sacrificing layer 160, a chemical mechanical polishing (CMP) process is performed to polish the sacrificing layer 160 using the lining layer 152 as a polish stop layer. A top portion of the sacrificing layer 160 is removed by CMP and the lining layer 152 that is directly above the sacrificing layer 104 is exposed. Preferably, after CMP, a consecutive etch process may be performed to selectively etch the sacrificing layer 160 such that the top surface of the remaining sacrificing layer 160 is about 200 nm lower than the top surface of the lining layer 152. As specifically indicated in FIG. 3, at this point, a recessed area 162 is formed.

Figure 4:
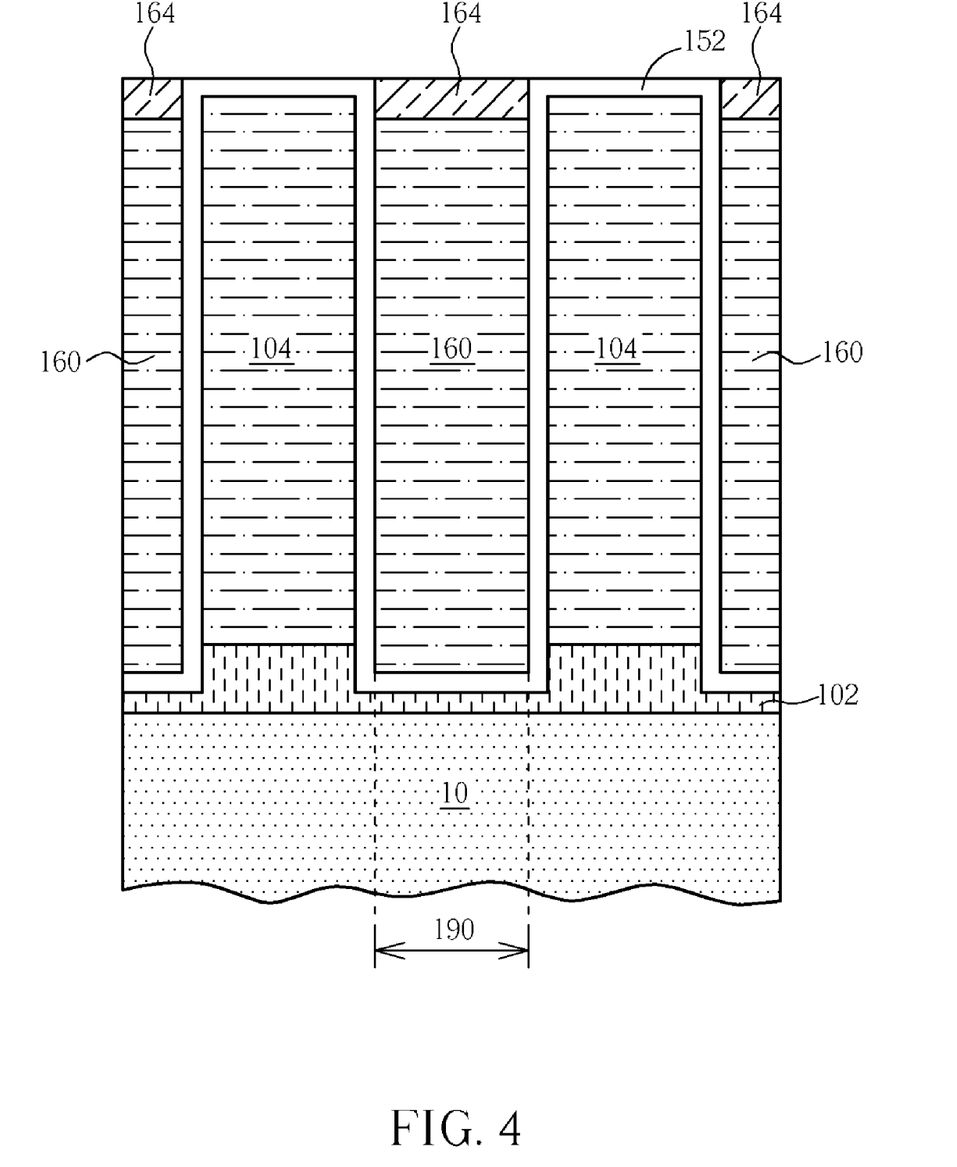

As shown in FIG. 4, a CVD process is then carried out to blanket deposit a first insulating layer 164 such as a BSG layer or USG layer having a thickness of about 300 nm. The first insulating layer 164 fills the recessed area 162 and covers the exposed surface of the lining layer 152.

Subsequently, using the lining layer 152 as a polish stop layer, another CMP process is performed to polish away a predetermined thickness of the first insulating layer 164 thereby exposing the lining layer 152 that is directly above the sacrificing layer 104.

In other preferred embodiments, the lining layer 152 that is directly above the sacrificing layer 104 may be polished away, and the sacrificing layer 104 may be exposed. Further, the first insulating layer 164 may be formed by other methods such as oxidation methods.

Figure 5:
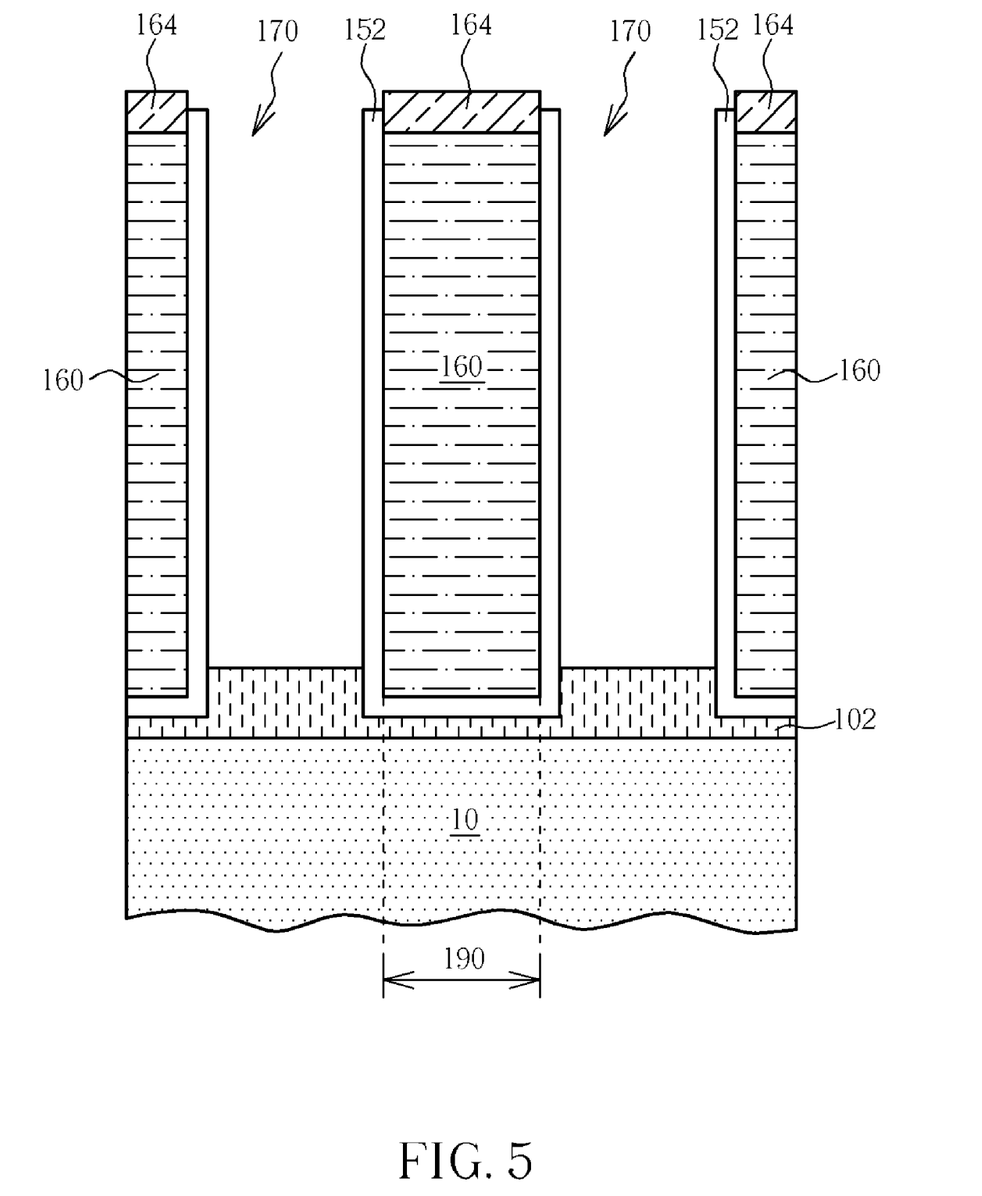

As shown in FIG. 5, the lining layer 152 positioned directly above the sacrificing layer 104 is etched away using any suitable method such as wet etching, thereby exposing the sacrificing layer 104. A dry etching process is then performed to remove the sacrificing layer 104 to form an opening 170. By virtue of the high etch selectivity between the sacrificing layer 104 and the first insulating layer 164, the sacrificing layer 104 can be completely removed with only a small portion of the first insulating layer 164 removed. By way of example, the etch selectivity between polysilicon (an example of sacrificing layer 104) and USG (an example of first insulating layer 164) may exceed 100. At this point, the sacrificing layer 160 is encapsulated by the first insulating layer 164 and the remaining lining layer 152.

Figure 6:
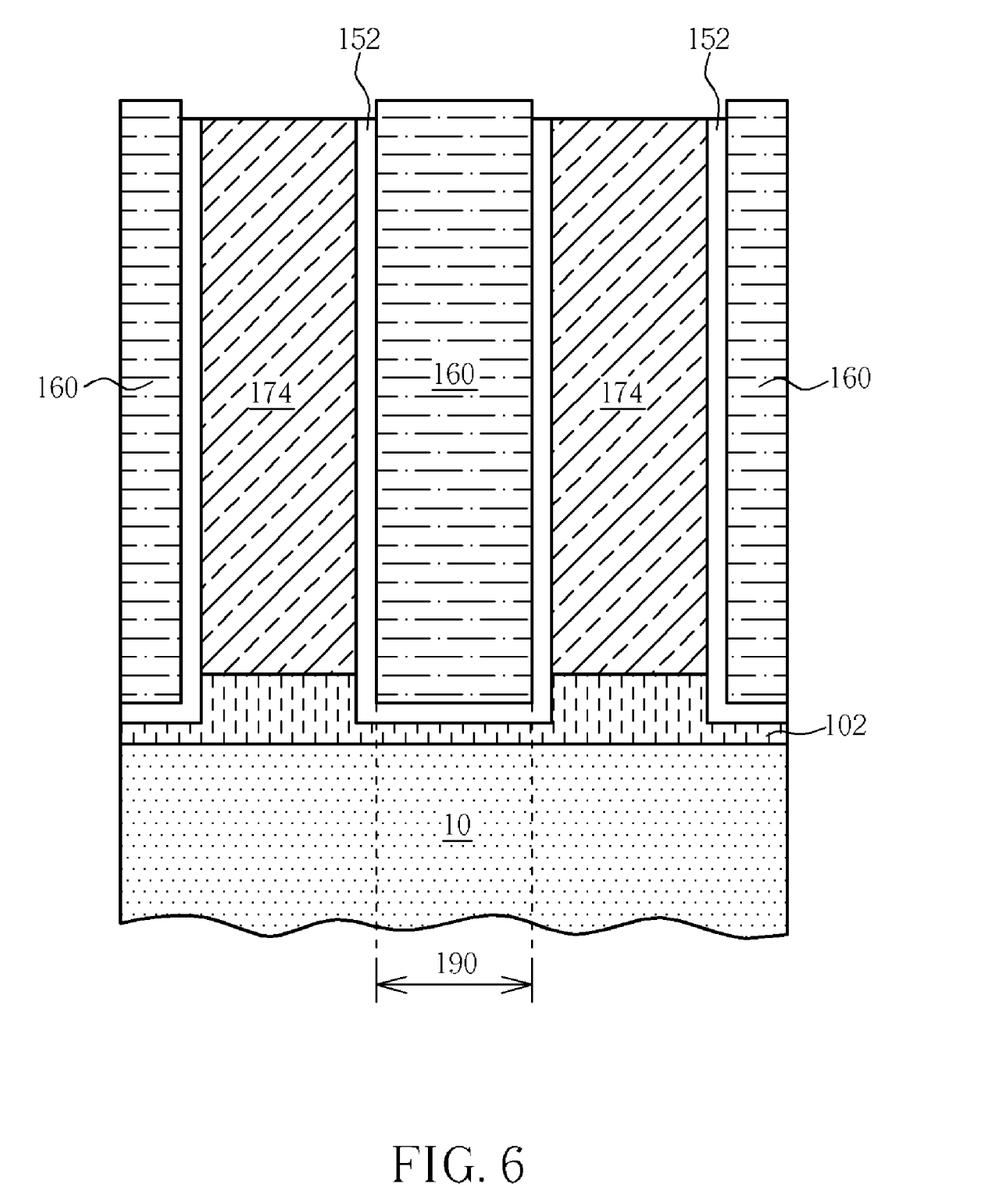

As shown in FIG. 6, a CVD process is performed to blanket deposit a second insulating layer 174 such as a BSG layer or USG layer, preferably USG layer, over the semiconductor substrate 10. The second insulating layer 174 has a thickness of, for example, 300 nm, and fills the opening 170. Alternatively, the opening 170 is half filled with spin-coating glass. After curing the spin-coating glass, the remaining space inside the opening 170 is completely filled with silicon oxide dielectric materials deposited by CVD methods.

Subsequently, to expose the sacrificing layer 160, a dry etching process is performed to etch away a predetermined thickness of the second insulating layer 174 and the first insulating layer 164. In this step, the first insulating layer 164 is completely removed.

Figure 7:
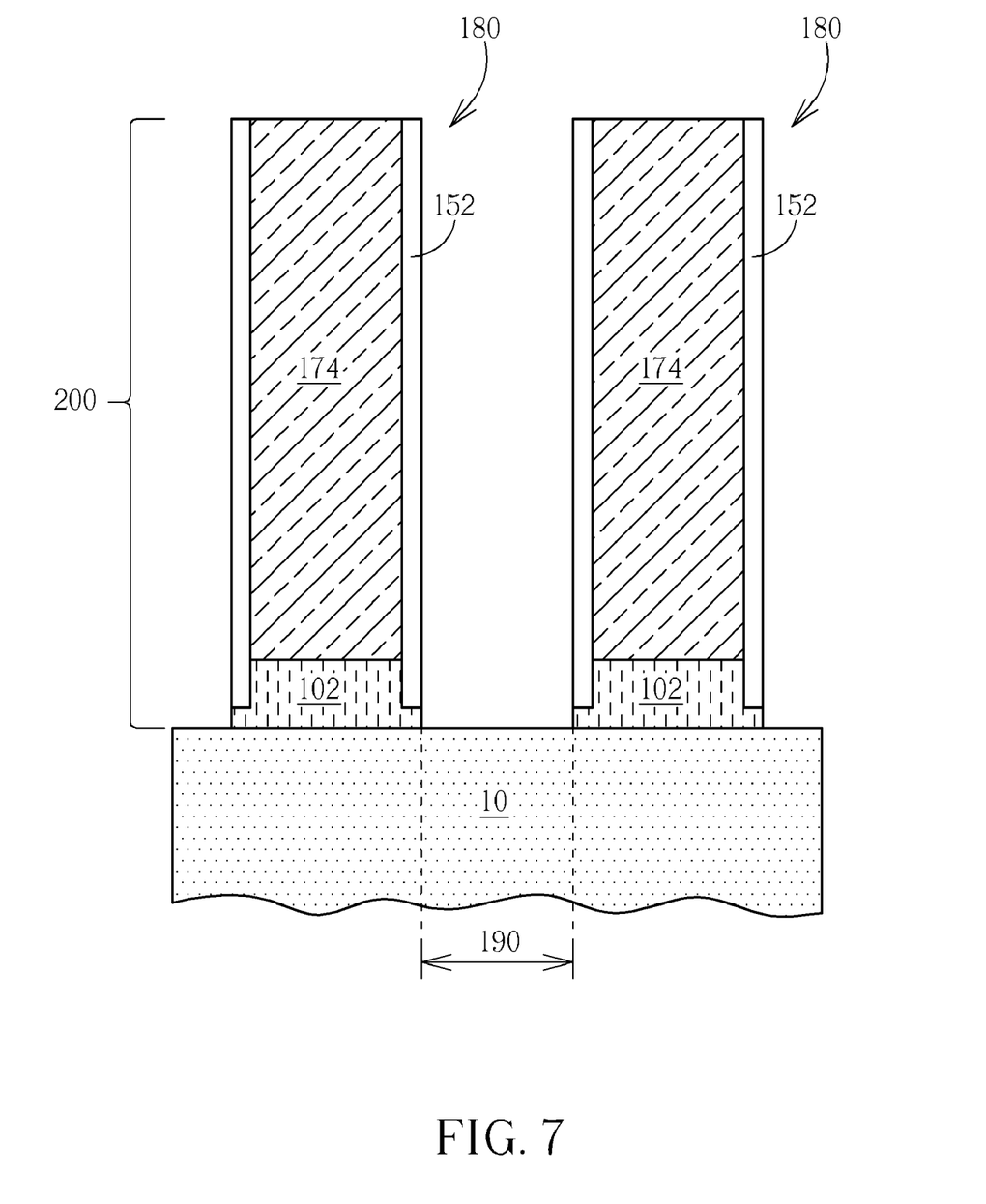

As shown in FIG. 7, an etching process such as a dry etching process or wet etching process is performed to completely remove the exposed sacrificing layer 160, thereby forming an opening 180. Thereafter, a dry etching process is carried out to remove the lining layer 152 and the pad layer 102 at the bottom of the opening 180, thereby exposing a portion of the semiconductor substrate 10. At this point, a thick hard mask 200 is formed on the semiconductor substrate 10. The thick hard mask 200 includes the second insulating layer 174, the pad layer 102 and the lining layer 152. The sidewall profile of the opening 180 in the thick hard mask 200 is well controlled and the sidewall of the opening 180 is nearly vertical.

Figure 8:
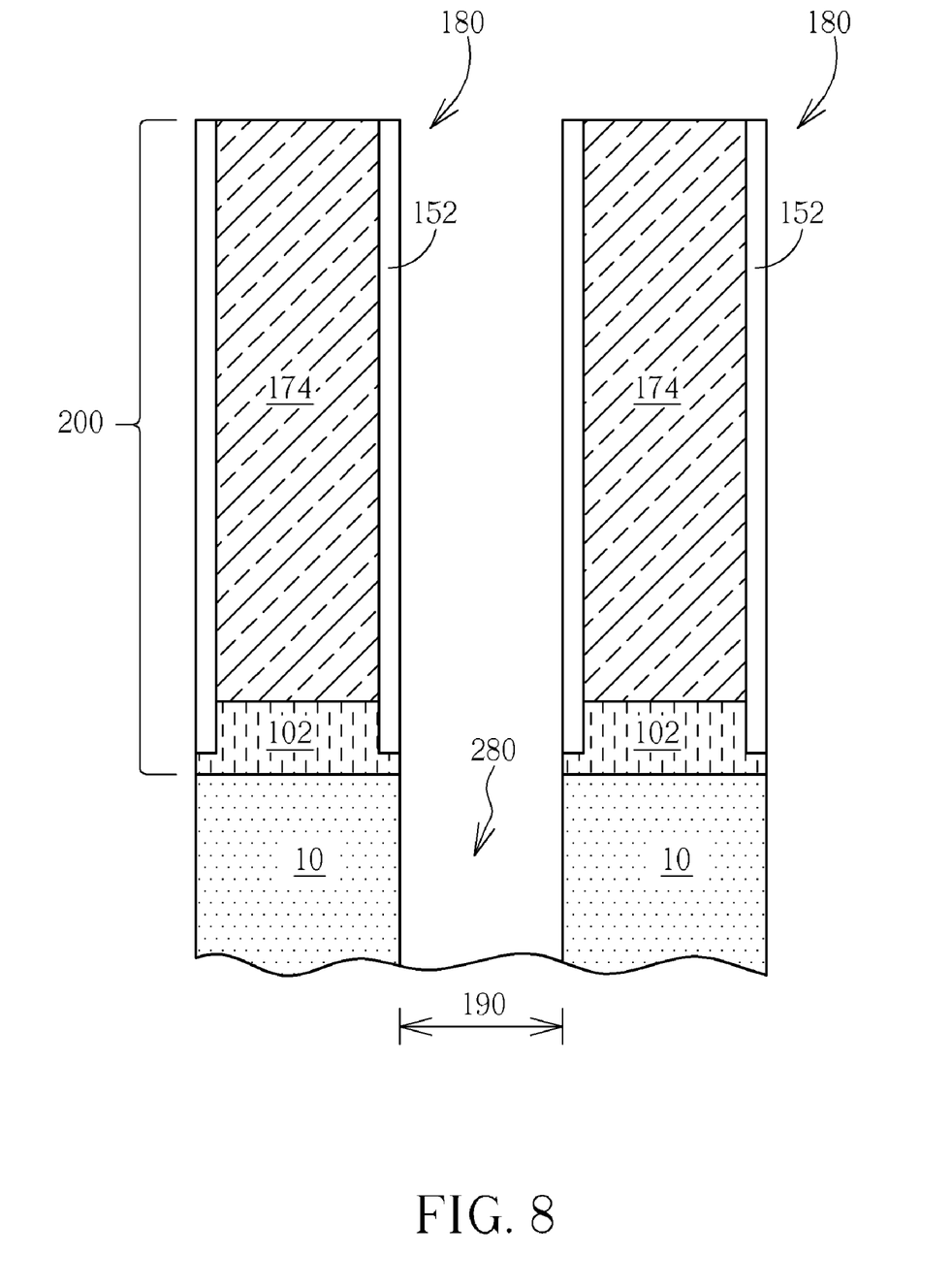

As shown in FIG. 8, using the thick hard mask 200 include the second insulating layer 174, the pad layer 102 and the lining layer 152 as an etching hard mask, a dry etching process is performed to etch the exposed semiconductor substrate 10 through the opening 180, thereby forming a deep trench 280 which is offset to the opening 170. Since the opening 180 in the thick hard mask 200 has nearly vertical sidewall profile and due to the protective lining layer 152, the size, sidewall profile and dimension of the deep trench 280 can be precisely controlled.

Those skilled in the art will readily observe that numerous modifications and alterations of the device and method may be made while retaining the teachings of the invention.

What is claimed is:

1. A method for fabricating a deep trench in a substrate, comprising the steps of:
   providing a substrate having thereon a pad layer and a first sacrificing layer on the pad layer, wherein the first sacrificing layer has at least one first opening;
   forming a lining layer on interior surface of the at least one first opening and on the first sacrificing layer;
   filling the at least one first opening with a second sacrificing layer, wherein a top surface of the second sacrificing layer and the lining layer form a recessed area;
   forming a first insulating layer within the recessed area, wherein the first insulating layer and the lining layer enclose the second sacrificing layer;
   selectively etching away a portion of the lining layer, thereby exposing the first sacrificing layer;
   completely removing the first sacrificing layer, thereby forming a second opening;
   filling the second opening with a second insulating layer;
   removing the first insulating layer to expose the second sacrificing layer;
   completely removing the second sacrificing layer, thereby forming a thick hard mask on the substrate; and
   etching the substrate to form a deep trench.

2. The method according to claim 1, wherein the thick hard mask includes the second insulating layer, the lining layer and the pad layer.

3. The method according to claim 1, wherein the pad layer comprises a silicon nitride layer.

4. The method according to claim 1, wherein the first opening has a diameter that is larger than a target trench dimension of the deep trench.

5. The method according to claim 1, wherein the first sacrificing layer comprises polysilicon and amorphous silicon.

6. The method according to claim 1, wherein the lining layer comprises silicon oxide.

7. The method according to claim 1, wherein the second sacrificing layer is a polysilicon layer.

8. The method according to claim 1, wherein the first insulating layer comprises silicon oxide layer.

9. The method according to claim 1, wherein the second insulating layer comprises boron-doped silicon glass (BSG) and undoped silicon glass (USG).

10. A method for fabricating a trench in a substrate, comprising:
providing a substrate, wherein a sacrificing layer is formed on a top surface of the substrate, and wherein the sacrificing layer defines at least one first opening;
forming an insulating layer in the first opening to define a mask layer;
removing the sacrificing layer to form at least one second opening; and
etching the substrate through the second opening by using the mask layer as an etch hard mask to form a deep trench thereto.

11. The method according to claim 10, wherein the mask layer comprises a lining layer formed on a sidewall of the insulating layer.

12. The method according to claim 10, wherein the method further comprises forming a pad layer on the substrate.

13. The method according to claim 12, wherein the mask layer comprises the pad layer, the insulating layer and the lining layer.

14. The method according to claim 11, wherein the method further includes forming a pad layer on the substrate.

15. The method according to claim 10, wherein the mask layer includes the pad layer, the insulating layer and the lining layer.

16. The method according to claim 11, wherein the mask layer includes the pad layer, the insulating layer and the lining layer.

17. The method according to claim 13, wherein the mask layer comprises the pad layer, the insulating layer and the lining layer.

* * * * *